United States Patent
Guo et al.

(10) Patent No.: US 11,862,250 B2
(45) Date of Patent: Jan. 2, 2024

(54) OPEN BLOCK-BASED READ OFFSET COMPENSATION IN READ OPERATION OF MEMORY DEVICE

(71) Applicant: YANGTZE MEMORY TECHNOLOGIES CO., LTD., Wuhan (CN)

(72) Inventors: Xiaojiang Guo, Wuhan (CN); Jong Hoon Kang, Wuhan (CN); Youxin He, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 166 days.

(21) Appl. No.: 17/459,430

(22) Filed: Aug. 27, 2021

(65) Prior Publication Data

US 2022/0293187 A1    Sep. 15, 2022

Related U.S. Application Data

(63) Continuation of application No. PCT/CN2021/080130, filed on Mar. 11, 2021.

(51) Int. Cl.
| | | |
|---|---|---|
| *G11C 7/00* | (2006.01) | |
| *G11C 16/10* | (2006.01) | |
| *G11C 16/08* | (2006.01) | |
| *G11C 16/26* | (2006.01) | |
| *G11C 16/30* | (2006.01) | |

(52) U.S. Cl.
CPC ............ *G11C 16/102* (2013.01); *G11C 16/08* (2013.01); *G11C 16/26* (2013.01); *G11C 16/30* (2013.01)

(58) Field of Classification Search
CPC ....... G11C 7/1051; G11C 7/22; G11C 7/1072; G11C 7/1006; G11C 7/1066
USPC ............. 365/189.15, 189.14, 189.12, 230.06
See application file for complete search history.

(56) References Cited

U.S. PATENT DOCUMENTS

| | | |
|---|---|---|
| 2016/0240262 A1 | 8/2016 | Shah et al. |
| 2018/0059971 A1 | 3/2018 | Jung et al. |
| 2018/0350446 A1* | 12/2018 | K ............................ G11C 29/76 |
| 2019/0286556 A1* | 9/2019 | You ..................... G11C 16/0483 |
| 2019/0304550 A1 | 10/2019 | Shen et al. |
| 2020/0051621 A1 | 2/2020 | Papandreou et al. |
| 2020/0125292 A1* | 4/2020 | Byun .................... G06F 3/0673 |
| 2020/0334148 A1 | 10/2020 | Lee |

OTHER PUBLICATIONS

International Search Report issued in corresponding International Application No. PCT/CN2021/080130, dated Dec. 8, 2021, 4 pages.

* cited by examiner

*Primary Examiner* — Son T Dinh
(74) *Attorney, Agent, or Firm* — BAYES PLLC

(57) ABSTRACT

Open block-based read offset compensation in read operation of memory device is disclosed. For example, a memory device includes an array of memory cells arranged in a plurality of blocks and a peripheral circuit coupled to the array of memory cells. The peripheral circuit is configured to, in response to a block of the plurality of blocks being an open block, perform a read operation on a memory cell of the array of memory cells in the block using a compensated read voltage. The compensated read voltage has an offset from a default read voltage of the block.

20 Claims, 12 Drawing Sheets

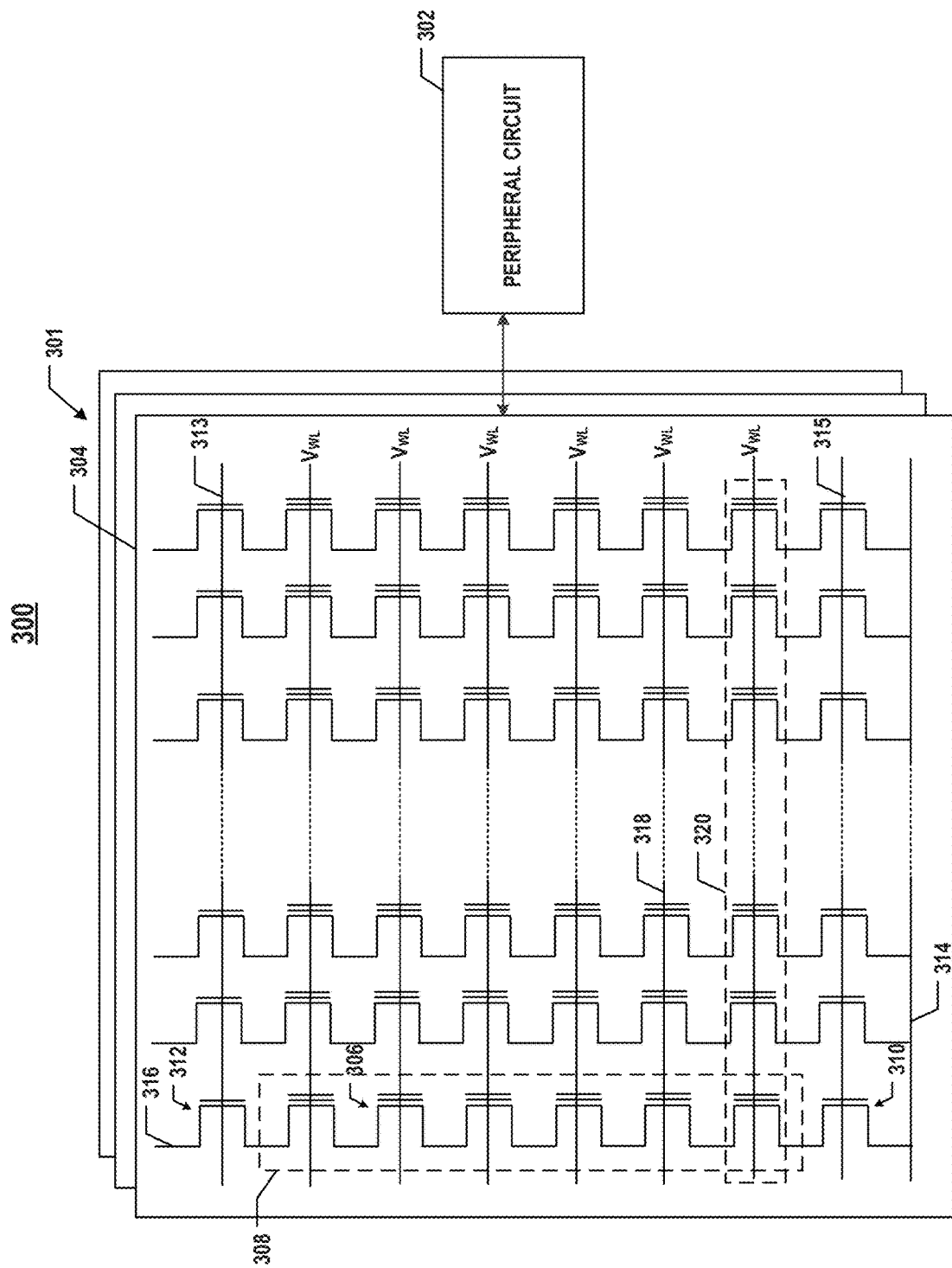

OPEN BLOCK-BASED READ OFFSET COMPENSATION IN READ OPERATION OF MEMORY DEVICE

CROSS-REFERENCE TO RELATED APPLICATIONS

This application is continuation of International Application No. PCT/CN2021/080130, filed on Mar. 11, 2021, entitled "OPEN BLOCK-BASED READ OFFSET COMPENSATION IN READ OPERATION OF MEMORY DEVICE," which is hereby incorporated by reference in its entirety.

BACKGROUND

The present disclosure relates to memory devices and operations thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, a program operation can be performed at the page level, and a read operation can be performed at the cell level.

SUMMARY

In one aspect, a memory device includes an array of memory cells arranged in a plurality of blocks and a peripheral circuit coupled to the array of memory cells. The peripheral circuit is configured to, in response to a block of the plurality of blocks being an open block, perform a read operation on a memory cell of the array of memory cells in the block using a compensated read voltage. The compensated read voltage has an offset from a default read voltage of the block.

In another aspect, a NAND Flash memory includes an array of memory cells arranged in a plurality of blocks, a register, control logic coupled to the register, and a word line driver coupled to the control logic. The register is configured to store open block information of one or more blocks of the plurality of blocks. The control logic is configured to determine an offset from a default read voltage of a block of the one or more blocks based on the open block information. The word line driver is configured to apply a compensated read voltage having the offset to a word line coupled to a memory cell of the array of memory cells in the block in a read operation on the memory cell.

In still another aspect, a system includes a NAND Flash memory and a host coupled to the NAND Flash memory and configured to initiate the open block information. The NAND Flash memory includes an array of memory cells arranged in a plurality of blocks, a register, control logic coupled to the register, and a word line driver coupled to the control logic. The register is configured to store open block information of one or more blocks of the plurality of blocks. The control logic is configured to determine an offset from a default read voltage of a block of the one or more blocks based on the open block information. The word line driver is configured to apply a compensated read voltage having the offset to a word line coupled to a memory cell of the array of memory cells in the block in a read operation on the memory cell.

In still another aspect, a method for operating a memory device is disclosed. The memory device includes an array of memory cells arranged in a plurality of blocks. A block of the plurality of blocks is determined to be an open block. A read operation is performed on a memory cell of the array of memory cells in the block using a compensated read voltage. The compensated read voltage has an offset from a default read voltage of the block.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 3 illustrates a schematic diagram of an exemplary memory device including peripheral circuits, according to some aspects of the present disclosure.

Figure 1:
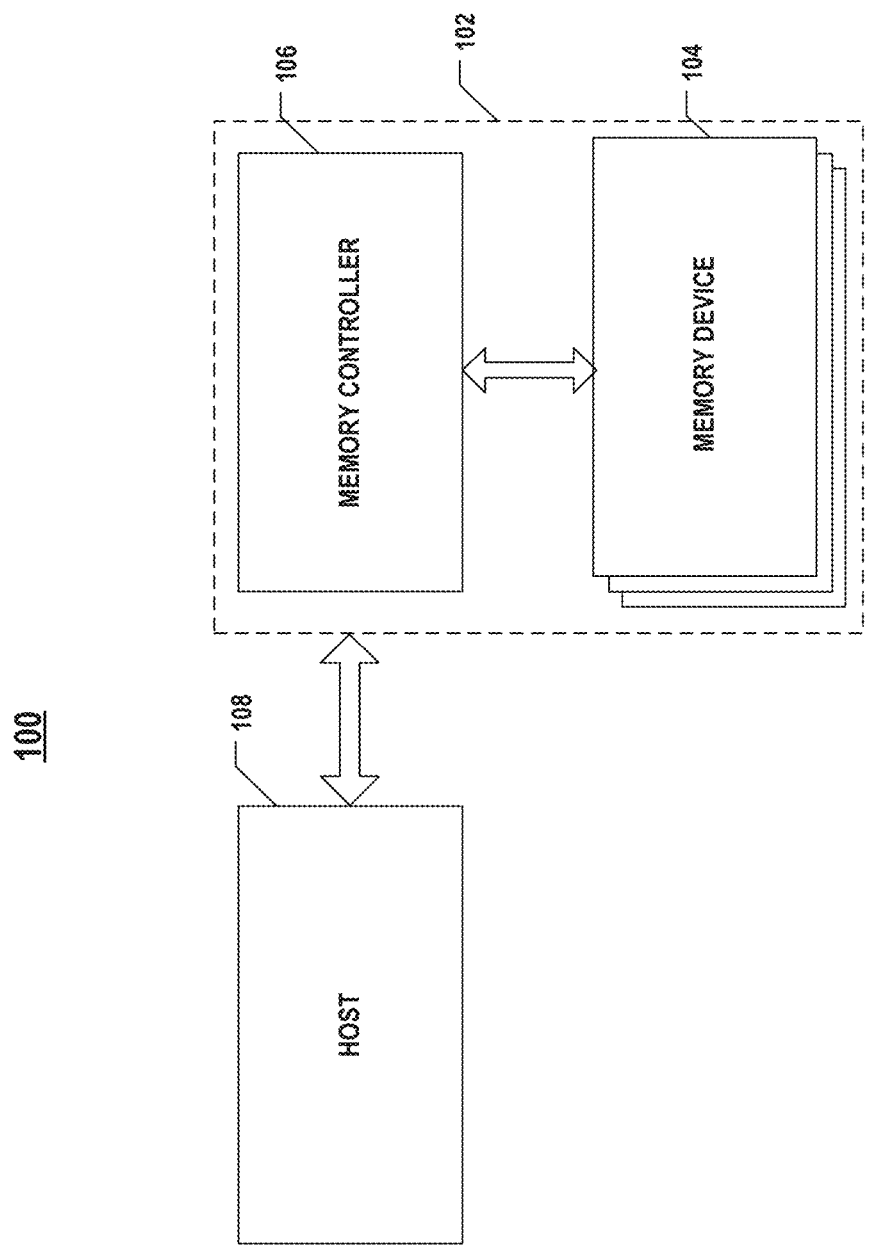
FIG. 1 illustrates a block diagram of an exemplary system having a memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Some memory devices, such as NAND Flash memory devices, can perform program (write) operations at the page level, i.e., programming all the memory cells in the same selected page at the same time. Depending on whether all the pages of a block have been programmed, a block of a NAND Flash memory can be either a full block or an open block. In the read operations, the threshold voltage of a memory cell in an open block appears lower than that in a full block under the same read condition due to the so-called back-pattern effect. However, known NAND Flash devices generally set their internal read conditions (e.g., read voltage level) based on the full block case, which, when applied to an open block, may cause more read errors when reading memory cells in the open block due to the negatively shifted threshold voltages in the open block.

To address one or more aforementioned issues, the present disclosure introduces a solution in which the read conditions (e.g., read voltage level) are adjusted when reading an open block. When reading memory cells in an open block, a compensated read voltage having an offset from the default read voltage can be determined and used to compensate for the threshold voltage shift due to the back-pattern effect, thereby reducing the read errors (e.g., fail bits). Various approaches can be used to calculate the offset, for example, based on the last programmed page in the open block. In some implementations, open blocks are identified from open block information saved and updated by the NAND Flash memory device, such as from the auto dynamic start voltage (ADSV) list used for recording program start voltages to speed up the program speed. In some implementations, the open block-based read offset compensation is performed with other types of read offsets and thus, does not introduce much overhead to the device performance.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. Consistent with some aspects of the present disclosure, in some implementations, memory device 104, such as a NAND Flash memory device, can perform on-die open block-based read offset compensation to compensate for the threshold voltage shift of memory cells in open blocks in read operations due to back-pattern effect, thereby reducing the read errors, as described below in detail.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Consistent with some aspects of the present disclosure, in some implementations, memory controller 106 is configured to fully or partially perform the open block-based read offset compensation, as described below in detail.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
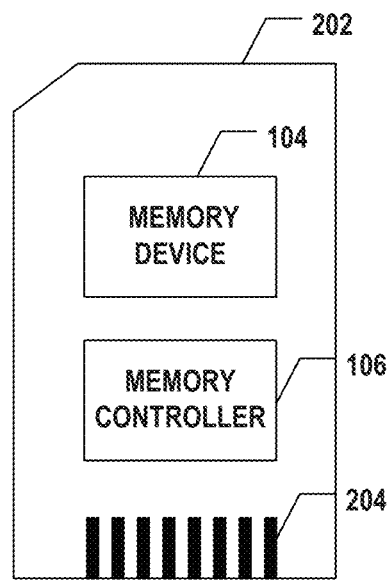
FIG. 2A illustrates a diagram of an exemplary memory card having a memory device, according to some aspects of the present disclosure.
Figure 2B:
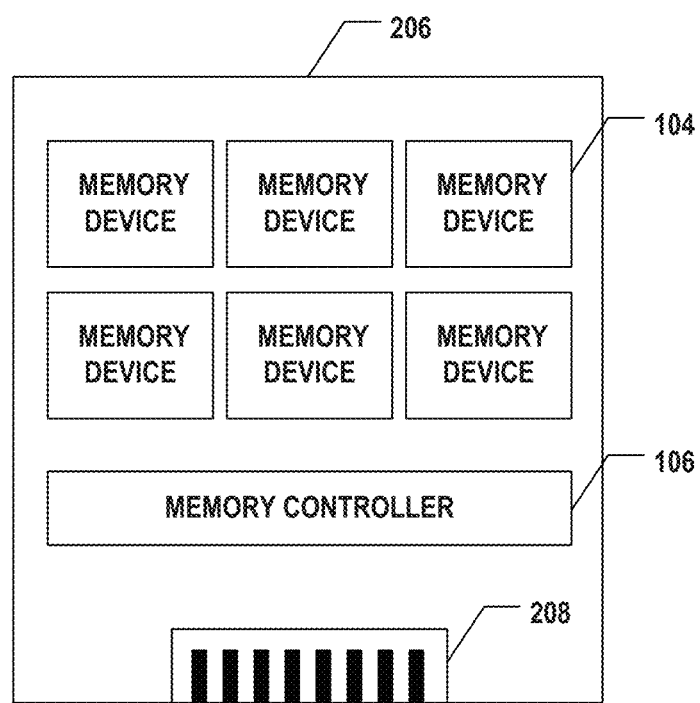
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. For ease of description, memory cells 306 in one page 320 may be coupled to a same word line 318, and the terms "page" and "word line" may be used interchangeably in the present disclosure. It is understood that, however, in some examples, memory cells 306 in one page 320 may be coupled to more than one word line 318. Each word line 318 can include a plurality of control gates (gate electrodes) at each memory cell 306 in respective page 320 and a gate line coupling the control gates.

Figure 4A:
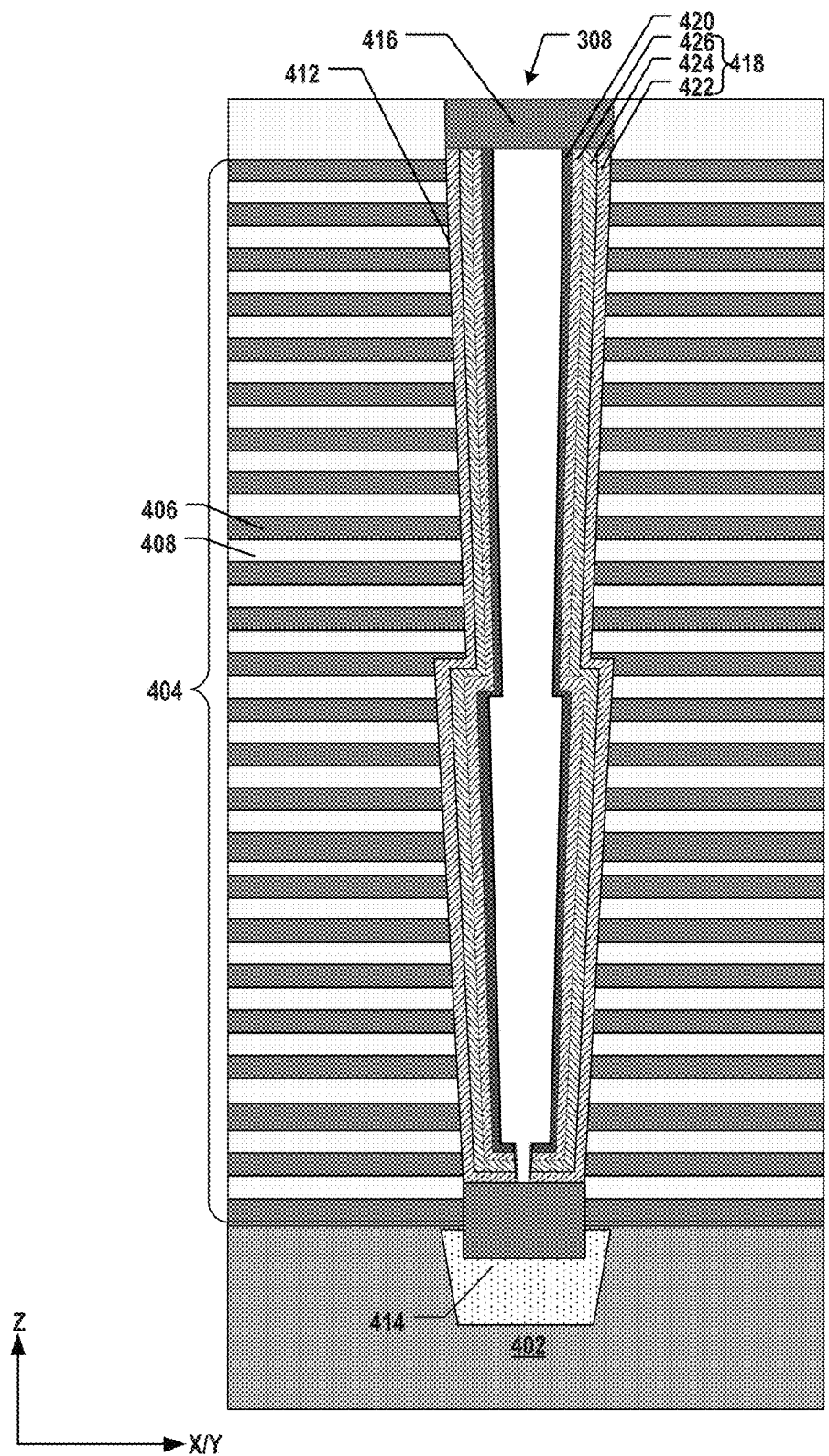
FIGS. 4A and 4B illustrate a side view and a plan view of cross-sections of an exemplary memory cell array including NAND memory strings, respectively, according to some aspects of the present disclosure.
Figure 4B:
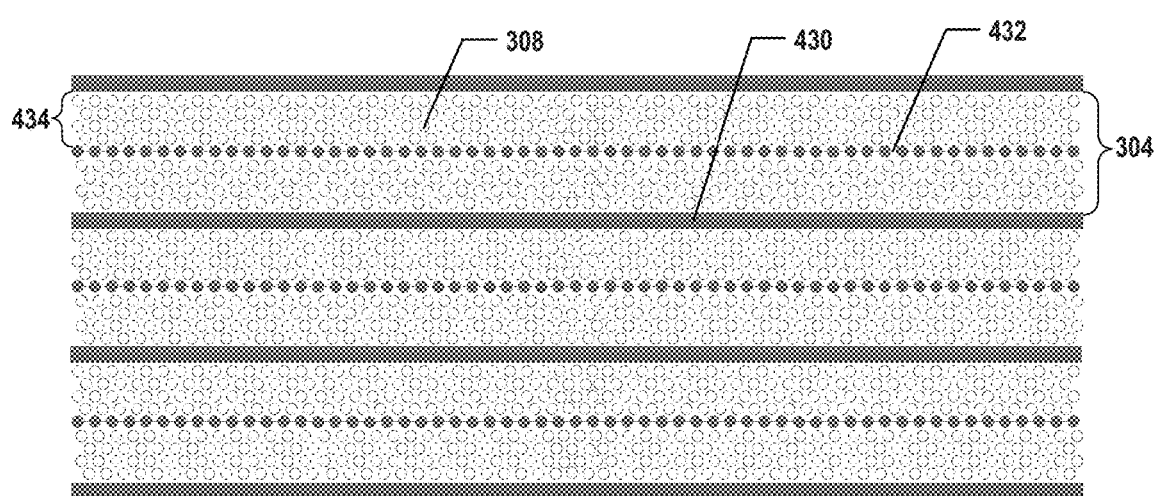

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, DSG 312, or SSG 310, and can extend laterally as DSG line 313 at the top of memory stack 404, SSG line 315 at the bottom of memory stack 404, or word line 318 between DSG line 313 and SSG line 315.

As shown in FIG. 4A, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In some implementations, each block 304 can be further divided into smaller areas (e.g., fingers 434) by DSG cuts 432, which electrically separate DSG lines 313 between adjacent fingers 434, such that each finger 434 may be individually controlled in read and program operations. It is understood that although not shown in FIGS. 4A and 4B, additional components of memory cell array 301 can be formed including, but not limited to, local contacts, interconnect layers, etc.

As shown in FIG. 3, consistent with the scope of the present disclosure, since a program operation is performed at the page/word line level for each block 304, each block 304 can be either an open block or a full block depending on whether all pages in respective block 304 have all been programmed. In some implementations, block 304 is an open block if at least one page 320 in block 304 is not programmed, i.e., memory cells 306 in at least one page 320 in block 304 are in the erased state. For example, an open block may include one or more unprogrammed pages. In some implementations, block 304 is a full block if all pages 320 in block 304 are programmed, i.e., memory cells 306 in all pages 320 in block 304 are in the programmed states. For example, a full block may not include any unprogrammed page. Peripheral circuit 302 can be configured to, in response to block 304 being an open block, perform a read operation on memory cell 306 in the open block using a compensated read voltage, which has an offset from a default read voltage. Conversely, peripheral circuit 302 can also be configured to, in response to block 304 being a full block, perform a read operation on memory cell 306 in the full block using the default read voltage.

Figure 5:
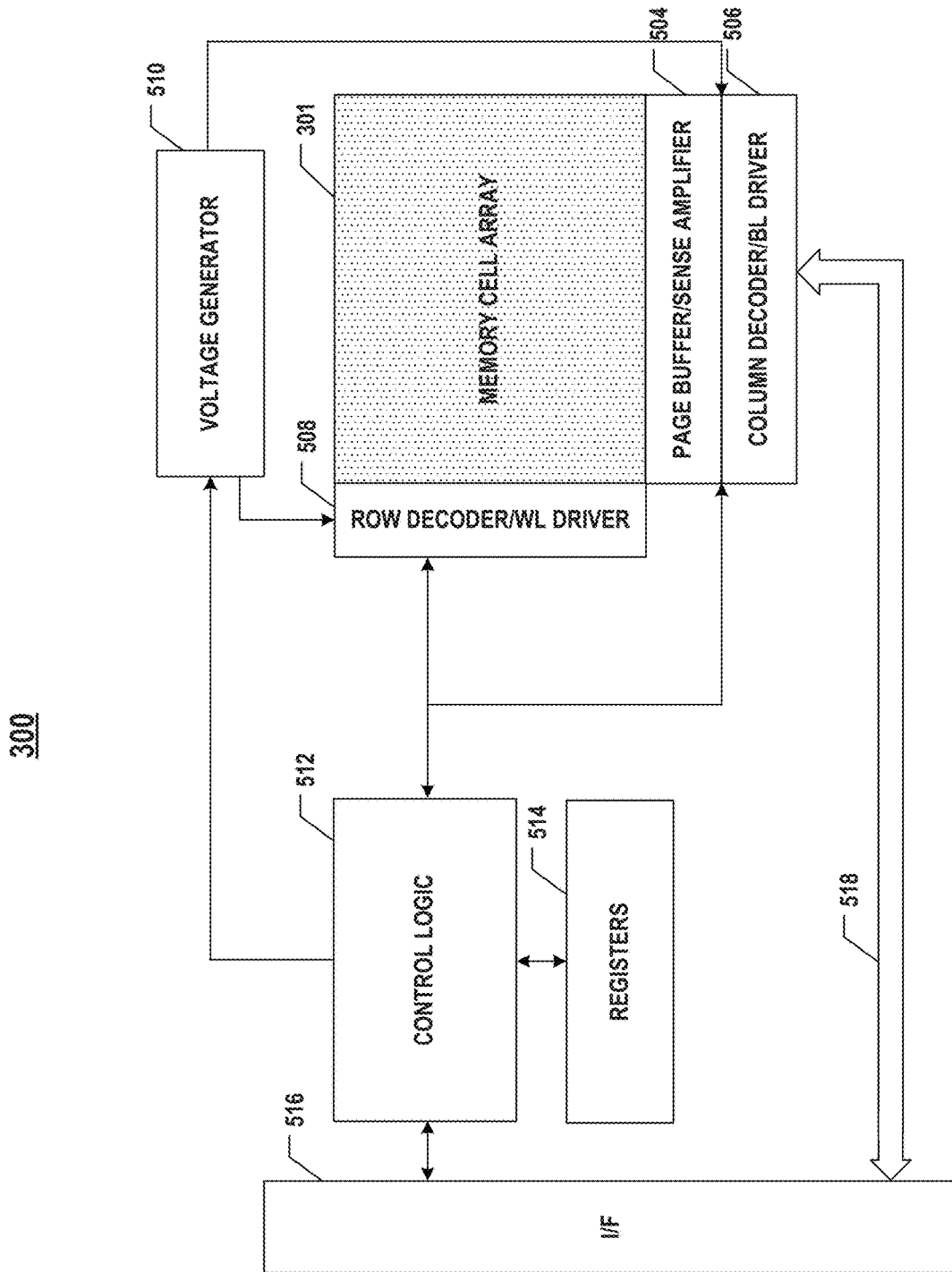
FIG. 5 illustrates a block diagram of an exemplary memory device including a memory cell array and peripheral circuits, according to some aspects of the present disclosure.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. As described below in detail, row decoder/word line driver 508 is configured to apply a read voltage to selected word line 318 in a read operation on memory cell 306 coupled to selected word line 318. The read voltage can be either the compensated read voltage with the open block-based read offset when the read voltage is applied to word line 318 in an open block or the default read voltage without the open block-based read offset when the read voltage is applied to word line 318 in a full block.

Voltage generator 510 can be configured to be controlled by control logic 512 and generate the word line voltages (e.g., read voltage, program voltage, pass voltage, local voltage, verification voltage, etc.), bit line voltages, and source line voltages to be supplied to memory cell array 301. As described below in detail, depending on whether the read operation is performed in an open block or a full block, control logic 512 can control voltage generator 510 to provide either a default read voltage or a compensated read voltage having an offset from the default read voltage to row decoder/word line driver 508.

Control logic 512 can be coupled to each peripheral circuit described above and configured to control operations of each peripheral circuit. Registers 514 can be coupled to control logic 512 and include status registers, command registers, and address registers for storing status information, command operation codes (OP codes), and command addresses for controlling the operations of each peripheral circuit. As described below in detail, the status registers of registers 514 can include one or more registers configured to store open block information indicative of the open block(s) of all blocks 304 in memory cell array 301, such as having an ADSV list. In some implementations, the open block information is also indicative of the last programmed page of each open block.

Interface 516 can be coupled to control logic 512 and act as a control buffer to buffer and relay control commands received from a host (not shown) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 301.

Figure 6:
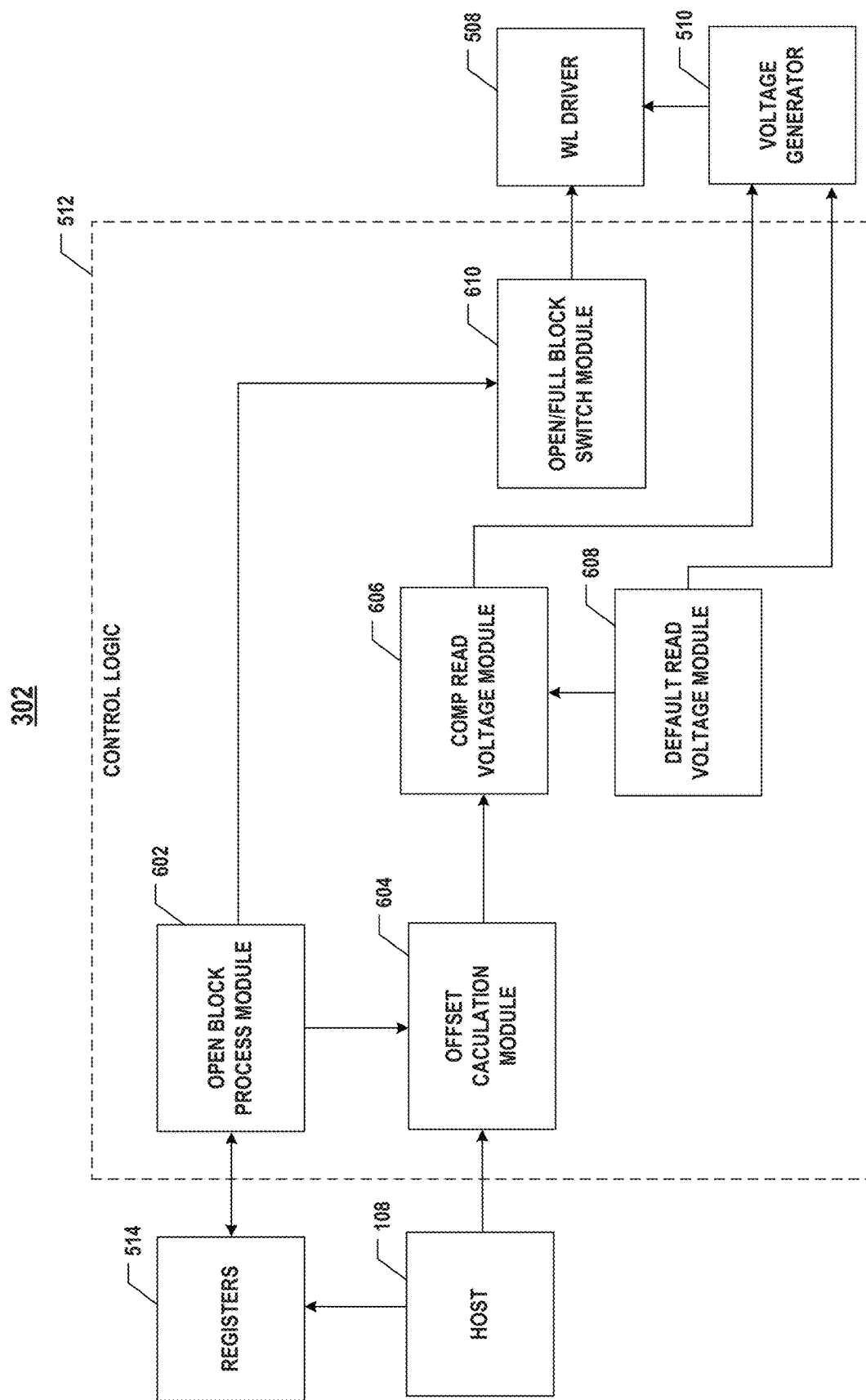
FIG. 6 illustrates a detailed block diagram of exemplary peripheral circuits of the memory device in FIGS. 3-5 in performing open block-based read offset compensation, according to some aspects of the present disclosure.

FIG. 6 illustrates a detailed block diagram of exemplary peripheral circuits 302 of memory device 300 in FIGS. 3-5 in performing open block-based read offset compensation, according to some aspects of the present disclosure. As shown in FIG. 6, in some implementations, in performing the open block-based read offset compensation, control logic 512 includes an open block process module 602, an offset calculation module 604, a compensated read voltage module 606, a default read voltage module 608, and an open/full block switch module 610. Each module of control logic 512 described herein can be either a software module running on a processor, such as a microcontroller unit (MCU), which is part of control logic 512, or a hardware module of a finite-state machine (FSM), such as an integrated circuit (IC, e.g., application-specific IC (ASIC), field-programmable gate array (FPGA), etc.), or a combination of software module and hardware module.

Open block process module 602 can be coupled to register 514 and configured to determine if a block is an open block based on open block information stored in register 514. The block includes each block that has a memory cell to be read by a read operation, i.e., the selected block in a read operation, according to some implementations. The block information can be indicative of one or more open blocks of the blocks. In some implementations, the block information indicates all the current open block(s) and is updated as the program operations proceed. For example, open block process module 602 of control logic 512 may be configured to update the open block information in a program operation on the memory cell array. In some implementations, host 108 is coupled to register 514 and configured to initiate the open block information. For example, to initiate the open block information, host 108 may be configured to, in response to system restart, scan the memory cell array or restore a backup copy of the open block information. That is, there is a handshaking mechanism for power loss and/or error handling cases to allow host 108 to initiate the open block information, according to some implementations. Host 108 can be responsible for re-inputting the open block information back to register 514 of memory device 300 upon power loss and/or error handling. In some implementations, upon system restart due to either power loss or error handling, host 108 scans the memory cell array to collect the open block information from the memory cell array and store the open block information into register 514. In some implementations, host 108 saves a backup copy of open block information into memory device 300 (e.g., non-volatile memory cells as opposed to register 514) during normal operation and upon system restart, restore the saved backup copy of the most-recent open block information and store it into register 514. It is understood that in some examples, host 108 may be responsible for initiating the open block information before the normal operations of memory device 300, while open block process module 602 is responsible for updating the open block information during the normal operations of memory device 300.

Figure 8:
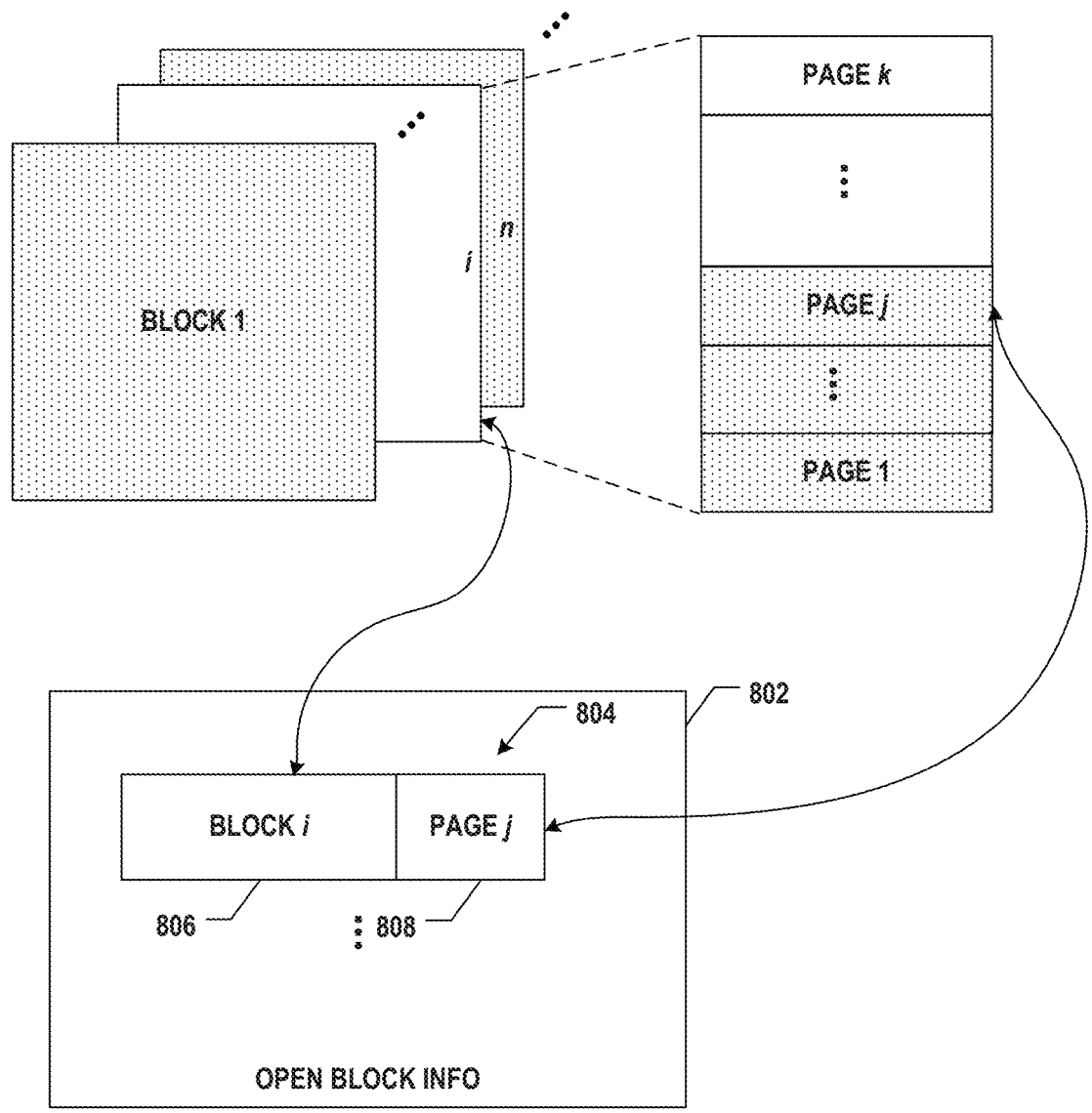
FIG. 8 illustrates a diagram of exemplary open block information of a memory device, according to some aspects of the present disclosure.

For example, FIG. 8 illustrates a diagram of exemplary open block information 802 of memory device 300, according to some aspects of the present disclosure. Open block information 802 can be indicative of each open block 806 i of all blocks 1-n. In some implementations, open block information 802 includes the identifiers (IDs), such as logic addresses or physical addresses, of each open block 806, but not the full blocks, as shown in FIG. 8. In some implementations, open block information 802 includes each block with a field indicative of whether this block is an open block or a full block (not shown). Open block information 802 can also be indicative of the last programmed page of in the block. For example, as shown in FIG. 8, for each open block 806 i, the last programmed page 808 j of all pages 1-k in open block i may be included in open block information 802 as well. That is, open block information 802 can include the last programmed page 808 j of each open block 806 i. It is understood that in case the full blocks are also included in open block information 802, the last programmed page may not be necessary as it is known for each full block, In some implementations, the open block information includes an ADSV list, and open block process module 602 is configured to determine that the block is an open block if the block is on the ADSV list. Open block process module 602 is also configured to determine that the block is a full block if the block is not on the ADSV list. Memory device 300 can each utilize the ADSV list to track the start voltage levels that are used to program corresponding blocks/word lines. For subsequent programming events (e.g., program operations) to that particular memory location, memory device 300 can refer to the stored programming start voltages, which can result in improved programming time (Tprog) performance. That is, memory device 300, for example, control logic 512, is configured to update and track the ADSV list stored in register 514 in program operations to speed up the programming time. Since the ADSV list also records the block programming information, e.g., whether all pages/word lines of a particular block have all been programmed, for open block-based read offset compensation in read operations, memory device 300, for example, control logic 512, may "borrow" the ADSV list and use it as at least part of the open block information. In some implementations, host 108 is configured to initiate the ADSV list by scanning the memory cell array and stored the initial ADSV list into register 514 upon system restart, and control logic 512 is configured to maintain, track, and update the ADSV list based on the program operations performed by memory device 300. In some implementations, the ADSV list also includes the last programmed page of each block. For example, as shown in FIG. 8, open block information may include an ADSV list 804 that indicates each open block 806 i and its last programmed page 808 j.

Referring back to FIG. 6, for performing a read operation on a memory cell, open block process module 602 can retrieve the open block information, e.g., an ADSV list, from register 514 and determine whether the block in which the memory cell belongs is an open block or a full block based on the open block information. In one example in which the open block information is indicative of each open block, but not full blocks, open block process module 602 may check to see if the block matches with the open block information. For example, open block process module 602 of control logic 512 may be configured to determine that the block is an open block if the block is on the ADSV list. In another example in which the open block information includes all the blocks, open block process module 602 may look for the block in the open block information and find the open/full block status/field of the block. The result of whether the block is an open block or not is provided by open block process module 602 to open/full block switch module 610, such that open/full block switch module 610 controls word line driver 508 to apply a compensated read voltage or a default read voltage to the word line coupled to the memory cell to be read, according to some implementations, as described below in detail.

As described above, the threshold voltage of a memory cell in an open block may shift negatively compared with a memory cell in a full block due to the back-patterned effect. It is found that when the program operations start from the source side of a block (e.g., from the bottom page/word line in FIG. 3), it may exhibit a wider programmed voltage (PV) distribution. When many pages/word lines are programmed in the NAND memory string, the memory cell array loading resistance may greatly increase, leading to the threshold voltage Vth shift for the earlier-programmed memory cells, which is called the back-pattern effect. The major mechanism of the back-pattern effect may come from the decreased virtual drain potential of the selected word line when drain-side other pages/word lines are programmed.

Figure 7:
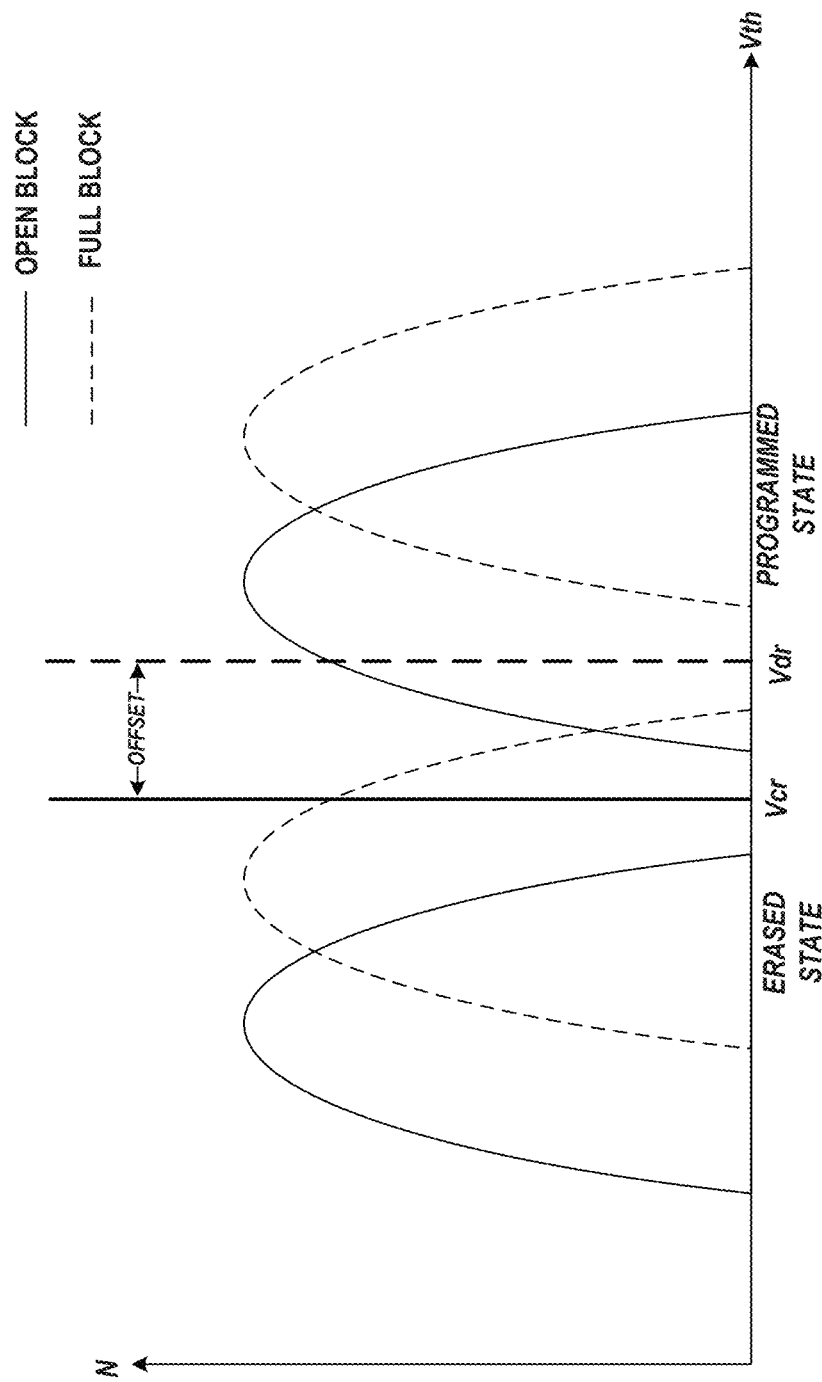
FIG. 7 illustrates a diagram of exemplary threshold voltage distributions in a read operation of a memory device, according to some aspects of the present disclosure.

As shown in FIG. 7, the threshold voltage Vth distributions of a memory cell in an open block (represented by solid lines) in both programmed state and erased state may shift negatively compared with a memory cell in a full block (represented by dashed lines) due to the back-pattern effect. As a result, the default read voltage Vdr that is set based on the threshold voltage Vth distributions of the memory cell in the full block may no longer be able to differentiate the programmed state and the erased state for the memory cell in the open block in a read operation. Instead, an offset from the default read voltage Vdr may need to be applied to compensate for the threshold voltage Vth shift due to the open block, thereby forming a compensated read voltage for reading the memory cell in the open block.

Referring back to FIG. 6, in case the block is an open block, offset calculation module 604 of control logic 512 can be configured to determine the compensated read voltage having the offset from the default read voltage for the block based on the open block information. As described above, the threshold voltage shift in open blocks is caused by the back-pattern effect, which can be affected by the number of pages/word lines that have been programmed in the open block. Thus, in some implementations, offset calculation module 604 is further configured to determine the offset for compensating for the threshold voltage shift based on the last programmed page. As described above, the open block information can also indicate the last programmed page of each open block (e.g., last programmed page 808 j in FIG. 8) and thus, offset calculation module 604 can obtain the last programmed page from the open block information, such as the ADSV list.

Figure 9A:
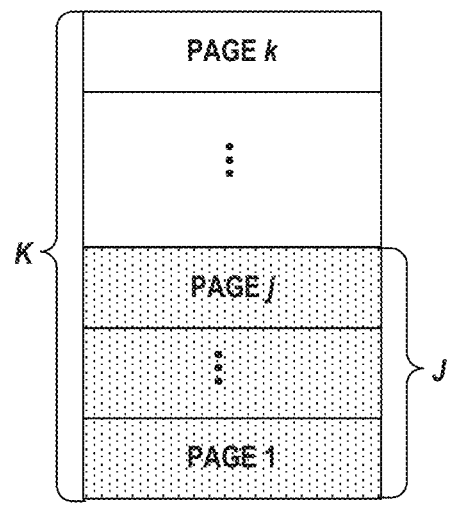
FIGS. 9A and 9B illustrate exemplary read offset calculation schemes of an open block, according to various aspects of the present disclosure.

In some implementations, offset calculation module 604 is configured to calculate the offset based on the last programmed page and the total number of pages in the open block. For example, as shown in FIG. 9A, an open block may include a total number of K pages 1-k, J of which are programmed pages 1-j, as indicated by the last programmed page j. Offset calculation module 604 may calculate the total number of J programmed pages in the block based on the last programmed page j, and then may calculate a ratio a between the total number J of programmed pages and the total number of N pages in the block, for example, a=J/K. Offset calculation module 604 then may calculate the offset Voff based on the ratio a and a maximum offset Vtot, for example, Voff=(1−a)×Vtot. The maximum offset Vtot may be predetermined in the case none of the pages in the open block has been programmed yet, which may cause the maximum threshold voltage shift compared with the full block. As the number of programmed pages J increases, the corresponding offset Voff decreases accordingly since the threshold voltage shift also decreases compared with the full block. It is understood that the example of calculating the offset described above is only for illustrative purposes and does not exclude any other suitable ways of calculating the offset based on the last programmed page and the total number of pages in the open block. For example, a weight may be added to the calculation to adjust the ratio, or a non-linear relationship may be introduced between the offset and the maximum offset.

Figure 9B:
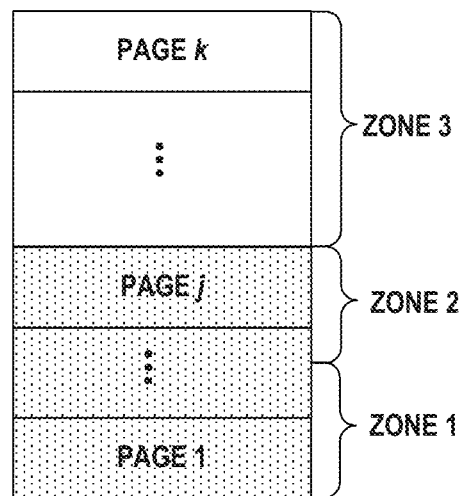

In some implementations, offset calculation module 604 is configured to select the offset from a plurality of preset offsets based on one of a plurality of zones in which the last programmed page is in the open block. The pages in each block can be separated into a plurality of zones associated with the plurality of preset offsets, respectively. In some implementations, the zones are associated with the preset offsets by post-fabrication trimming of memory device 300. Post-fabrication trimming may be used to counter the effects of manufacturing process variation on certain critical electrical parameters of a semiconductor device, such as memory device 300. Trimming may be performed iteratively by adjusting the resistance value of a trim circuit to specific discrete values, such as corresponding to the preset offsets. For example, as shown in FIG. 9B, the K pages 1-k of an open block may be separated into multiple zones, e.g., three zones 1-3. Each zone may be associated with a respective preset offset based on the physical locations of the word lines in the open block (e.g., the vertical positions in the z-direction of gate conductive layers 406 in FIG. 4A) by post-fabrication trimming after fabricating memory device 300. Depending on the programming direction, an upper zone may be associated with a lower offset than a lower zone, or vice versa. The offset Voff may be selected from the preset offsets based on the zone in which the last programmed page j falls into, e.g., zone 2 in FIG. 9B. Compared with the calculation-based approach in FIG. 9A, the zone-based approach in FIG. 9B may be less complicated but with higher coarseness.

Referring back to FIG. 6, in some implementations, offset calculation module 604 of control logic 512 is coupled to host 108 and configured to determine the offset based on the open block information and an additional offset factor. The additional offset factor can include at least one of temperature, word line physical location, or system adjustment. In some implementations, host 108 is configured to send a command to offset calculation module 604 of control logic 512 indicative of an additional offset factor, such as temperature, word line physical location, or system adjustment. That is, besides the open block-based read offset compensation, additional read offset compensation may be performed based on the instruction from host 108. For example, host 108 may determine a temperature-based read offset, a word line physical location-based offset, or any system adjustment to the read voltage level and instruct offset calculation module 604 of control logic 512 to take those additional offset factors into consideration when determining the offset of the compensated read voltage from the default read voltage.

Default read voltage module 608 of control logic 512 can be configured to determine the default read voltage for full blocks and control voltage generator 510 to provide the read voltage at the default read voltage level to word line driver 508. Default read voltage module 608 can also provide the default read voltage to compensated read voltage module 606 as the baseline for compensated read voltage module 606 to calculate the compensated read voltage for open blocks. In some implementations, default read voltage module 608 of control logic 512 is further configured to adjust the default read voltage based on initial threshold voltage shift (IVS). That is, the threshold voltage of a memory cell, either in an open block or a full block, may shift negatively as time goes by. Thus, default read voltage module 608 can compensate for the threshold voltage shift due to IVS by adjusting the threshold voltage shift more negatively. The IVS-adjusted default read voltage can be used to read the memory cells in full blocks depending on the retention duration of the memory cells and may also affect the compensated read voltage as the baseline changes.

Compensated read voltage module 606 of control logic 512 can be configured to determine the compensated read voltage for the open block based on the offset determined by offset calculation module 604 and the default read voltage determined by default read voltage module 608, by example, by adding the offset to the default read voltage to shift the read voltage level more negatively for open blocks compared with full blocks, as shown in FIG. 7. As described above, the levels of the offset and the compensated read voltage may vary between different open blocks, for example, as the last programmed page varies in different open blocks. Similar to default read voltage module 608, compensated read voltage module 606 can also control voltage generator 510 to provide the read voltage at the compensated read voltage level to word line driver 508.

It is understood that although the open block-based read offset compensation scheme is described above with respect to various modules in control logic 512, which is part of memory device 300, i.e., an on-die implementation as control logic 512 may be on the same die as memory cell array 301, in some examples, part or the entirety of the open block-based read offset compensation scheme disclosed herein may be implemented by a memory controller (e.g., memory controller 106 in FIG. 1) coupled to memory device 300, i.e., an off-die implementation. For example, the memory controller may be configured to determine whether a block is an open block or a full block based on the open block information.

Word line driver 508 can be configured to, in response to the instruction from open/full block switch module 610 of control logic 512 indicative of the current read block being an open block or a full block, receive the corresponding compensated read voltage or default read voltage from voltage generator 510 and apply the corresponding compensated read voltage or default read voltage to the word line coupled to the target memory cell to be read in either the open block or full block in a read operation.

Figure 10:
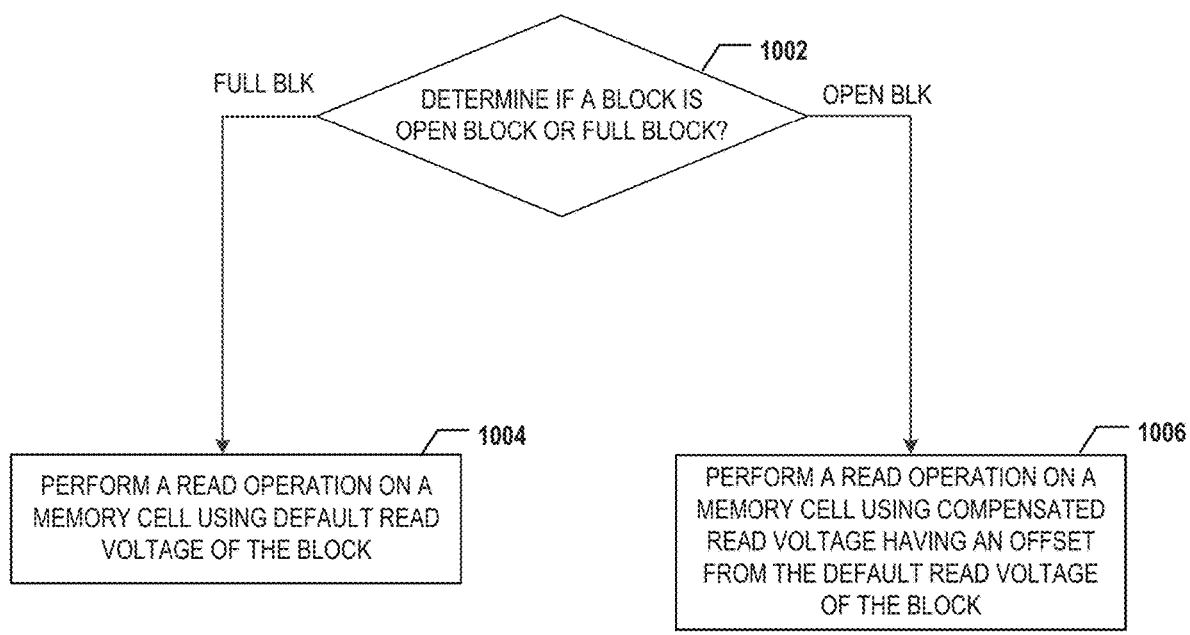
FIG. 10 illustrates a flowchart of an exemplary method for operating a memory device, according to some aspects of the present disclosure.

FIG. 10 illustrates a flowchart of a method 1000 for operating a memory device, according to some aspects of the present disclosure. The memory device may be any suitable memory device disclosed herein, such as memory device 300. Method 1000 may be implemented by peripheral circuit 302, such as row decoder/word line driver 508, voltage generator 510, control logic 512, and register 514. It is understood that the operations shown in method 1000 may not be exhaustive and that other operations can be performed as well before, after, or between any of the illustrated operations. Further, some of the operations may be performed simultaneously, or in a different order than shown in FIG. 10.

Figure 11:
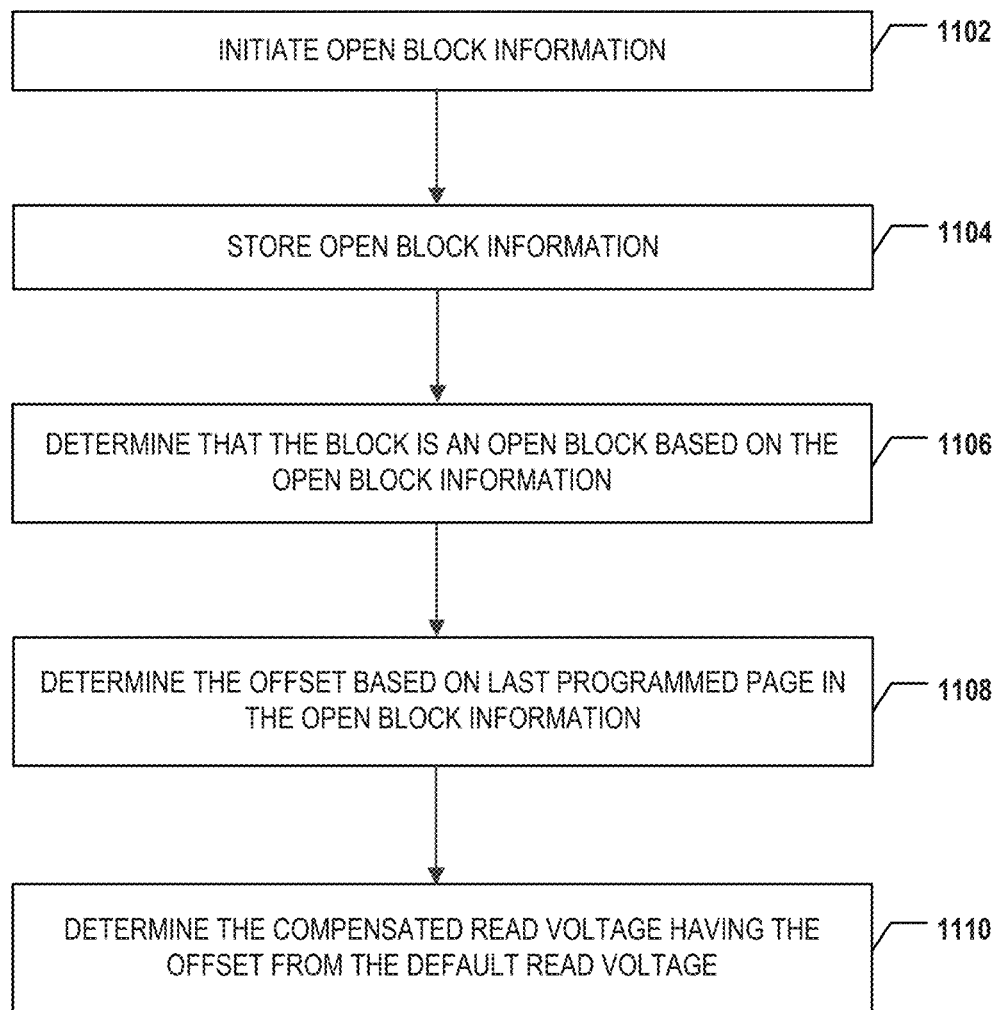
FIG. 11 illustrates a flowchart of an exemplary method for read offset compensation based on open block information, according to some aspects of the present disclosure.

Referring to FIG. 10, method 1000 starts at operation 1002, in which whether a block is an open block or a full block is determined. In some implementations, each block includes a plurality of pages, and the block is an open block if at least one page of the plurality of pages in the block is not programmed. For example, control logic 512 or memory controller 106 may determine whether a block is an open block or a full block based on open block information stored in register 514. In some implementations, as shown in FIG. 11, at 1102, the open block information is initiated, for example, by host 108, in response to system restart, by scanning memory cell array 301 or restoring a backup copy of the open block information. At 1104, the open block information of one or more open blocks of the plurality of blocks may be stored, for example, in register 514. At 1106, whether the block is an open block or a full block may be determined based on the open block information, for example, by open block process module 602 of control logic 512. In some implementations, the open block information may be updated in a program operation on the array of memory cells, for example, by open block process module 602. In some implementations, the open block information includes an ADSV list.

Method 1000 proceeds to operation 1004, as illustrated in FIG. 10, in which a read operation is performed on a memory cell in the block using the default read voltage if the block is a full block. For example, control logic 512 may determine the default read voltage, control voltage generator 510 to provide the default read voltage, and control word line driver 508 to apply the default read voltage to the word line coupled to the memory cell in the full block.

Method 1000 proceeds to operation 1006, as illustrated in FIG. 10, in which a read operation is performed on a memory cell in the block using the compensated read voltage having an offset from the default read voltage if the block is an open block. For example, control logic 512 may determine the offset based on the open block information, determine the compensated read voltage based on the offset and the default read voltage, control voltage generator 510 to provide the compensated read voltage, and control word line driver 508 to apply the compensated read voltage to the word line coupled to the memory cell in the open block. In some implementations, as shown in FIG. 11, at 1108, the offset may be determined based on the last programmed page in the open block information, for example, by offset calculation module 604 of control logic 512. As described above in detail with respect to FIGS. 9A and 9B, the offset may be determined by the calculation-based approach, the zone-based approach, or any other suitable approaches based on the last programmed page. At 1110, the compensated read voltage having the offset from the default read voltage may be determined, for example, by compensated read voltage module 606 of control logic 512.

According to one aspect of the present disclosure, a memory device includes an array of memory cells arranged in a plurality of blocks and a peripheral circuit coupled to the array of memory cells. The peripheral circuit is configured to, in response to a block of the plurality of blocks being an open block, perform a read operation on a memory cell of the array of memory cells in the block using a compensated read voltage. The compensated read voltage has an offset from a default read voltage of the block.

In some implementations, each block of the plurality of blocks includes a plurality of pages, and the peripheral circuit is further configured to determine that the block is an open block if at least one page of the plurality of pages in the block is not programmed.

In some implementations, each block of the plurality of blocks includes a plurality of pages, and the memory device further includes a memory controller coupled to the peripheral circuit and configured to determine that the block is an open block if at least one page of the plurality of pages in the block is not programmed.

In some implementations, the peripheral circuit includes a register configured to store open block information of one or more blocks of the plurality of blocks, and control logic coupled to the register and configured to determine that the block is an open block based on the open block information stored in the register.

In some implementations, to perform the read operation, the control logic is further configured to determine the compensated read voltage based on the open block information, and the peripheral circuit further includes a word line driver coupled to the control logic and configured to apply the compensated read voltage to a word line coupled to the memory cell.

In some implementations, the open block information includes an ADSV list, and the control logic is configured to determine that the block is an open block if the block is on the ADSV list.

In some implementations, the open block information is indicative of a last programmed page of the plurality of pages in the block, and to determine the compensated read voltage, the control logic is configured to determine the offset of the compensated read voltage from the default read voltage of the block based on the last programmed page.

In some implementations, to determine the offset, the control logic is configured to calculate the offset based on the last programmed page and a total number of pages in the block.

In some implementations, the control logic is further configured to calculate a total number of programmed pages in the block based on the last programmed page, calculate a ratio between the total number of programmed pages and the total number of pages in the block, and calculate the offset based on the ratio and a maximum offset.

In some implementations, the plurality of pages in the block are separated into a plurality of zones, the plurality of zones being associated with a plurality of preset offsets, respectively, and to determine the offset, the control logic is configured to select the offset from the plurality of preset offsets based on one of the plurality of zones in which the last programmed page is in the block.

In some implementations, the plurality of zones are associated with the plurality of preset offsets by post-fabrication trimming of the memory device.

In some implementations, the peripheral circuit is further configured to, in response to the block being a full block, perform a read operation on the memory cell using the default read voltage of the block.

In some implementations, the array of memory cells includes NAND Flash memory cells.

In some implementations, the control logic is configured to determine the offset based on the open block information and an additional offset factor.

In some implementations, the additional offset factor comprises at least one of temperature, word line physical location, or system adjustment.

According to another aspect of the present disclosure, a NAND Flash memory includes an array of memory cells arranged in a plurality of blocks, a register, control logic coupled to the register, and a word line driver coupled to the control logic. The register is configured to store open block information of one or more blocks of the plurality of blocks. The control logic is configured to determine an offset from a default read voltage of a block of the one or more blocks based on the open block information. The word line driver is configured to apply a compensated read voltage having the offset to a word line coupled to a memory cell of the array of memory cells in the block in a read operation on the memory cell.

In some implementations, the control logic is further configured to determine that the block is an open block based on the open block information stored in the register.

In some implementations, the NAND Flash memory further comprises a memory controller coupled to the control logic and configured to determine that the block is an open block based on the open block information stored in the register.

In some implementations, each block of the plurality of blocks includes a plurality of pages, and the control logic or the memory controller is configured to determine that the block is an open block if at least one page of the plurality of pages in the block is not programmed.

In some implementations, the open block information comprises an ADSV list, and the control logic or the memory controller is configured to determine that the block is an open block if the block is on the ADSV list.

In some implementations, the open block information is indicative of a last programmed page of the plurality of pages in the block, and the control logic is configured to determine the offset based on the last programmed page.

In some implementations, to determine the offset, the control logic is configured to calculate the offset based on the last programmed page and a total number of pages in the block.

In some implementations, to calculate the offset, the control logic is configured to calculate a total number of programmed pages in the block based on the last programmed page, calculate a ratio between the total number of programmed pages and the total number of pages in the block, and calculate the offset based on the ratio and a maximum offset.

In some implementations, the plurality of pages in the block are separated into a plurality of zones, the plurality of zones being associated with a plurality of preset offsets, respectively, and to determine the offset, the control logic is configured to select the offset from the plurality of preset offsets based on one of the plurality of zones in which the last programmed page is in the block.

In some implementations, the plurality of zones are associated with the plurality of preset offsets by post-fabrication trimming of the NAND Flash memory.

In some implementations, the control logic is configured to determine the offset based on the open block information and an additional offset factor.

In some implementations, the additional offset factor comprises at least one of temperature, word line physical location, or system adjustment.

According to still another aspect of the present disclosure, a system includes a NAND Flash memory and a host coupled to the NAND Flash memory and configured to initiate the open block information. The NAND Flash memory includes an array of memory cells arranged in a plurality of blocks, a register, control logic coupled to the register, and a word line driver coupled to the control logic. The register is configured to store open block information of one or more blocks of the plurality of blocks. The control logic is configured to determine an offset from a default read voltage of a block of the one or more blocks based on the open block information. The word line driver is configured to apply a compensated read voltage having the offset to a word line coupled to a memory cell of the array of memory cells in the block in a read operation on the memory cell.

In some implementations, the host is further configured to send a command to the control logic indicative of an additional offset factor, and the control logic is configured to determine the offset based on the open block information and the additional offset factor.

In some implementations, the additional offset factor includes at least one of temperature, word line physical location, or system adjustment.

In some implementations, to initiate the open block information, the host is configured to, in response to system restart, scan the array of memory cells or restore a backup copy of the open block information.

In some implementations, the control logic is further configured to update the open block information in a program operation on the array of memory cells.

In some implementations, the open block information includes an ADSV list, and the control logic is configured to determine that the block is an open block if the block is on the ADSV list.

In some implementations, each block of the plurality of blocks includes a plurality of pages, the open block information is indicative of a last programmed page of the plurality of pages in the block, and the control logic is configured to determine the offset based on the last programmed page.

In some implementations, to determine the offset, the control logic is configured to calculate the offset based on the last programmed page and a total number of pages in the block.

In some implementations, to calculate the offset, the control logic is configured to calculate a total number of programmed pages in the block based on the last programmed page, calculate a ratio between the total number of programmed pages and the total number of pages in the block, and calculate the offset based on the ratio and a maximum offset.

In some implementations, the plurality of pages in the block are separated into a plurality of zones, the plurality of zones being associated with a plurality of preset offsets, respectively, and to determine the offset, the control logic is configured to select the offset from the plurality of preset offsets based on one of the plurality of zones in which the last programmed page is in the block.

In some implementations, the plurality of zones are associated with the plurality of preset offsets by post-fabrication trimming of the NAND Flash memory.

In some implementations, the control logic is further configured to adjust the default read voltage of the block based on initial threshold voltage shift.

According to still another aspect of the present disclosure, a method for operating a memory device is disclosed. The memory device includes an array of memory cells arranged in a plurality of blocks. A block of the plurality of blocks is determined to be an open block. A read operation is performed on a memory cell of the array of memory cells in the block using a compensated read voltage. The compensated read voltage has an offset from a default read voltage of the block.

In some implementations, each block of the plurality of blocks includes a plurality of pages, and the block is an open block if at least one page of the plurality of pages in the block is not programmed.

In some implementations, open block information of one or more blocks of the plurality of blocks is stored, and the block is determined to be an open block based on the open block information.

In some implementations, to perform the read operation, the compensated read voltage is determined based on the open block information, and the compensated read voltage is applied to a word line coupled to the memory cell.

In some implementations, the open block information includes an ADSV list, and the block is an open block if the block is on the ADSV list.

In some implementations, the open block information is indicative of a last programmed page of the plurality of pages in the block, and to determine the compensated read voltage, the offset of the compensated read voltage from the default read voltage of the block is determined based on the last programmed page.

In some implementations, to determine the offset, the offset is calculated based on the last programmed page and a total number of pages in the block.

In some implementations, to calculate the offset, a total number of programmed pages in the block is calculated based on the last programmed page, a ratio between the total number of programmed pages and the total number of pages in the block is calculated, and the offset is calculated based on the ratio and a maximum offset.

In some implementations, the plurality of pages in the block are separated into a plurality of zones, the plurality of zones being associated with a plurality of preset offsets, respectively, and to determine the offset, the offset is selected from the plurality of preset offsets based on one of the plurality of zones in which the last programmed page is in the block.

In some implementations, the plurality of zones are associated with the plurality of preset offsets by post-fabrication trimming of the memory device.

In some implementations, the open block information is initiated.

In some implementations, to initiate the open block information, in response to system restart, the array of memory cells is scanned, or a backup copy of the open block information is restored.

In some implementations, the open block information is updated in a program operation on the array of memory cells.

In some implementations, the block is determined to be a full block, and a read operation is performed on the memory cell based on the default read voltage of the block.

In some implementations, the array of memory cells includes NAND Flash memory cells.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
an array of memory cells arranged in a plurality of blocks; and
a peripheral circuit coupled to the array of memory cells and configured to, in response to a block of the plurality of blocks being an open block, perform a read operation on a memory cell of the array of memory cells in the block using a compensated read voltage, the compensated read voltage having an offset from a default read voltage of the block,
wherein the peripheral circuit comprises:
a register configured to store open block information of one or more blocks of the plurality of blocks, and
control logic coupled to the register and configured to determine that the block is an open block based on the open block information stored in the register.

2. The memory device of claim 1, wherein
each block of the plurality of blocks comprises a plurality of pages; and
the peripheral circuit is further configured to determine that the block is an open block if at least one page of the plurality of pages in the block is not programmed.

3. The memory device of claim 1, wherein
each block of the plurality of blocks comprises a plurality of pages; and
the memory device further comprises a memory controller coupled to the peripheral circuit and configured to determine that the block is an open block if at least one page of the plurality of pages in the block is not programmed.

4. The memory device of claim 2, wherein to perform the read operation,
the control logic is further configured to determine the compensated read voltage based on the open block information; and
the peripheral circuit further comprises a word line driver coupled to the control logic and configured to apply the compensated read voltage to a word line coupled to the memory cell.

5. The memory device of claim 2, wherein
the open block information comprises an auto dynamic start voltage (ADSV) list; and
the control logic is configured to determine that the block is an open block if the block is on the ADSV list.

6. The memory device of claim 4, wherein
the open block information is indicative of a last programmed page of the plurality of pages in the block; and
to determine the compensated read voltage, the control logic is configured to determine the offset of the compensated read voltage from the default read voltage of the block based on the last programmed page.

7. The memory device of claim 6, wherein to determine the offset, the control logic is configured to calculate the offset based on the last programmed page and a total number of pages in the block.

8. The memory device of claim 7, wherein the control logic is further configured to:
calculate a total number of programmed pages in the block based on the last programmed page;
calculate a ratio between the total number of programmed pages and the total number of pages in the block; and
calculate the offset based on the ratio and a maximum offset.

9. The memory device of claim 6, wherein
the plurality of pages in the block are separated into a plurality of zones, the plurality of zones being associated with a plurality of preset offsets, respectively, and
to determine the offset, the control logic is configured to select the offset from the plurality of preset offsets based on one of the plurality of zones in which the last programmed page is in the block.

10. The memory device of claim 9, wherein the plurality of zones are associated with the plurality of preset offsets by post-fabrication trimming of the memory device.

11. The memory device of claim 2, wherein the peripheral circuit is further configured to, in response to the block being a full block, perform a read operation on the memory cell using the default read voltage of the block.

12. The memory device of claim 1, wherein the control logic is configured to determine the offset based on the open block information and an additional offset factor.

13. The memory device of claim 12, wherein the additional offset factor comprises at least one of temperature, word line physical location, or system adjustment.

14. A NAND Flash memory, comprising:
an array of memory cells arranged in a plurality of blocks;
a register configured to store open block information of one or more blocks of the plurality of blocks;
control logic coupled to the register and configured to determine an offset from a default read voltage of a block of the one or more blocks based on the open block information; and
a word line driver coupled to the control logic and configured to apply a compensated read voltage having the offset to a word line coupled to a memory cell of the array of memory cells in the block in a read operation on the memory cell.

15. A system, comprising:
a NAND Flash memory comprising:
an array of memory cells arranged in a plurality of blocks;
a register configured to store open block information of one or more blocks of the plurality of blocks;
control logic coupled to the register and configured to determine an offset from a default read voltage of a block of the one or more blocks based on the open block information; and
a word line driver coupled to the control logic and configured to apply a compensated read voltage having the offset to a word line coupled to a memory cell of the array of memory cells in the block in a read operation on the memory cell; and
a host coupled to the NAND Flash memory and configured to initiate the open block information.

16. The system of claim 15, wherein
the host is further configured to send a command to the control logic indicative of an additional offset factor; and
the control logic is configured to determine the offset based on the open block information and the additional offset factor.

17. The system of claim 16, wherein the additional offset factor comprises at least one of temperature, word line physical location, or system adjustment.

18. The system of claim 15, wherein to initiate the open block information, the host is configured to, in response to system restart, scan the array of memory cells or restore a backup copy of the open block information.

19. The system of claim 15, wherein the control logic is further configured to update the open block information in a program operation on the array of memory cells.

20. The NAND Flash memory of claim 14, wherein the control logic is further configured to determine that the block is an open block based on the open block information stored in the register.

* * * * *